(12) United States Patent
Nakamura et al.

(10) Patent No.: US 9,698,020 B2
(45) Date of Patent: Jul. 4, 2017

(54) CMOS VT CONTROL INTEGRATION BY MODIFICATION OF METAL-CONTAINING GATE ELECTRODES

(71) Applicant: Tokyo Electron Limited, Tokyo (JP)

(72) Inventors: Genji Nakamura, Kai (JP); Toshio Hasegawa, Kai (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 14/918,503

(22) Filed: Oct. 20, 2015

(65) Prior Publication Data

US 2016/0111290 A1 Apr. 21, 2016

Related U.S. Application Data

(60) Provisional application No. 62/066,177, filed on Oct. 20, 2014.

(51) Int. Cl.
| | | |
|---|---|---|
| *H01L 21/3213* | (2006.01) | |
| *H01L 21/28* | (2006.01) | |
| *H01L 29/51* | (2006.01) | |
| *H01L 29/49* | (2006.01) | |
| *H01L 21/8238* | (2006.01) | |

(52) U.S. Cl.
CPC .. *H01L 21/28088* (2013.01); *H01L 21/32137* (2013.01); *H01L 21/32139* (2013.01); *H01L 21/823842* (2013.01); *H01L 29/4966* (2013.01); *H01L 29/517* (2013.01); *H01L 29/513* (2013.01)

(58) Field of Classification Search
CPC ......... H01L 21/28088; H01L 21/32137; H01L 21/32139; H01L 21/823842
See application file for complete search history.

(56) References Cited

U.S. PATENT DOCUMENTS

| | | | |
|---|---|---|---|
| 6,894,353 B2 * | 5/2005 | Samavedam ... | H01L 21/823814 257/365 |
| 2008/0146041 A1 * | 6/2008 | Sasaki ............... | H01J 37/32192 438/772 |
| 2011/0193181 A1 * | 8/2011 | Jung ................. | H01L 21/28088 257/411 |

* cited by examiner

*Primary Examiner* — Douglas Menz
(74) *Attorney, Agent, or Firm* — Wood Herron & Evans LLP (57) ABSTRACT

A method of forming a semiconductor device is disclosed in various embodiments. The method includes providing a substrate containing first and second device regions, and a high-k film on the substrate, depositing a metal nitride gate electrode film on the high-k film, forming a metal-containing gate electrode film on the metal nitride gate electrode film in the second device region but not in the first device region, and depositing a Si-based cap layer on the metal-containing gate electrode film in the second device region and on the metal nitride gate electrode film in the first device region.

18 Claims, 8 Drawing Sheets

CMOS VT CONTROL INTEGRATION BY MODIFICATION OF METAL-CONTAINING GATE ELECTRODES

CROSS-REFERENCE TO RELATED APPLICATIONS

This application is related to and claims priority to United States Provisional Application No. 62/066,177, filed Oct. 20, 2014, the entire contents of which are herein incorporated by reference.

FIELD OF THE INVENTION

The present invention relates to semiconductor processing, and more particularly to a method for manufacturing complementary metal oxide semiconductor (CMOS) devices with adjustable workfunction.

BACKGROUND OF THE INVENTION

In the semiconductor industry, the minimum feature sizes of semiconductor devices are approaching the deep submicron regime to meet the demand for faster, lower power microprocessors and digital circuits. The Si-based semiconductor technology is currently faced with major materials challenges to achieve further miniaturization of integrated circuit devices. A gate stack containing a $SiO_2$ gate dielectric and a degenerately doped polycrystalline Si gate electrode, which has served the industry for several decades, will be replaced with a gate stack having a higher capacitance.

High-capacitance materials, known as high-k materials (where "k" refers to the dielectric constant of the material), feature a dielectric constant greater than that of $SiO_2$ (k~3.9). In addition, high-k materials may refer to dielectric materials that are deposited onto substrates (e.g., $HfO_2$, $ZrO_2$) rather than grown on the surface of the substrates (e.g., $SiO_2$, $SiO_xN_y$). High-k materials may, for example, incorporate metallic silicates or oxides (e.g., $Ta_2O_5$ (k~26), $TiO_2$ (k~80), $ZrO_2$ (k~25), $Al_2O_3$ (k~9), HfSiO (k~5-25), and $HfO_2$ (k~25)).

In addition to the gate dielectric layer, the gate electrode layer also represents a major challenge for future scaling of semiconductor devices. The introduction of metal-containing gate electrodes to replace the traditional doped poly-Si gate electrode can bring about several advantages. These advantages include elimination of the poly-Si gate depletion effect, reduction in sheet resistance, better reliability and potentially better thermal stability on the advanced high-k dielectric materials. In one example, switching from poly-Si to a metal-containing gate electrode can achieve a 2-3 Angstrom (Å) improvement in the effective or electrical thickness of the gate stack. This improvement occurs largely because the problem of poly-Si depletion at the interfaces with other materials is removed entirely.

Work function, resistivity, and compatibility with complementary metal oxide semiconductor (CMOS) technology are key parameters for the new gate electrode materials. One of the material selection criteria for the metal-containing gate electrode is that the work function be tunable. The work function of a material is the minimum energy needed to remove an electron from a solid to a point immediately outside the solid surface. Positive-channel Metal Oxide Semiconductor (PMOS) and the Negative-channel Metal Oxide Semiconductor (NMOS) transistor gate electrodes require different gate materials be used for the gate electrode to achieve acceptable threshold voltages; the latter having a Fermi level near the silicon valence band (E~4 eV), and the former having a Fermi level near the conduction band (E~5.1 eV).

High-energy implantation of dopant ions (e.g., nitrogen ions) into a metal gate electrode layer in a gate stack has been previously researched in order to lower the work function. However, ion implantation methods that include exposing the metal layer to high-energy ions can damage the gate stack, for example cause charging damage of the dielectric layer that can increase the leakage current and decrease the reliability of the dielectric layer. The charging damage from exposure of high-energy ions is expected to increase as the minimum feature sizes get smaller and the different materials layers that form gate stacks get thinner. Therefore, new methods are needed for processing gate stacks and, in particular, new methods for tuning the work function of the gate stacks are needed.

SUMMARY OF THE INVENTION

A method of forming a semiconductor device is disclosed in various embodiments. According to one embodiment, the method includes providing a substrate containing first and second device regions, and a high-k film on the substrate, depositing a metal nitride gate electrode film on the high-k film, forming a metal-containing gate electrode film on the metal nitride gate electrode film in the second device region but not in the first device region, and depositing a Si-based cap layer on the metal-containing gate electrode film in the second device region and on the metal nitride gate electrode film in the first device region.

According to another embodiment, the method includes providing a substrate containing first and second device regions, and a high-k film on the substrate, depositing a first TiN gate electrode film on the high-k film, forming a second TiN gate electrode film on the first TiN gate electrode film in the second device region but not in the first device region, and depositing a Si-based cap layer on the first TiN gate electrode film in the first device region and on the second TiN gate electrode film in the second device region.

DETAILED DESCRIPTION OF SEVERAL EMBODIMENTS OF THE INVENTION

Embodiments of the invention provide a semiconductor device and method for manufacturing a semiconductor device containing metal-containing gate electrode films with a tunable work function.

Figure 1A:
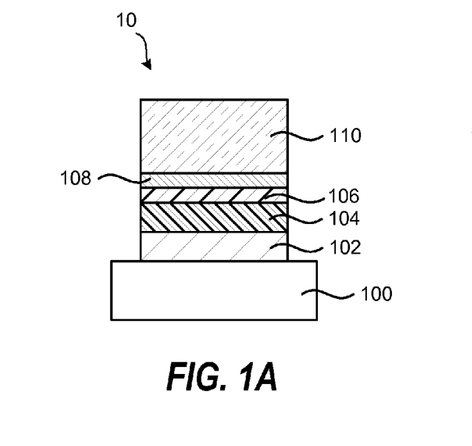
FIGS. 1A and 1B schematically show cross-sectional views of dual workfunction device regions in a semiconductor device according to an embodiment of the invention.
Figure 1B:
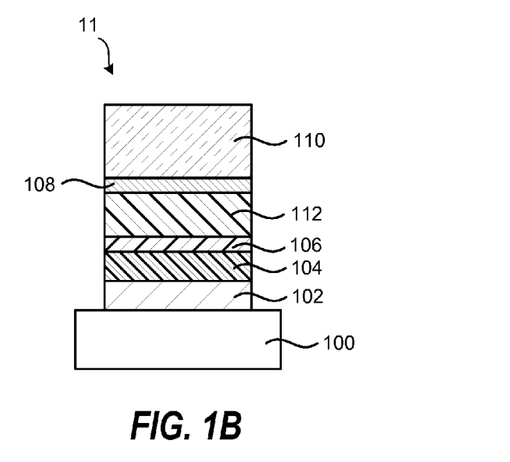

Referring now to the drawings, wherein like reference numerals designate identical or corresponding parts throughout the several views, FIGS. 1A and 1B schematically show cross-sectional views of dual workfunction device regions in a semiconductor device according to an embodiment of the invention. The device regions contain a first device region 10 for a NMOS in FIG. 1A, and a second device region 11 for a PMOS in FIG. 1B. In FIG. 1A, the first device region 10 contains a substrate 100, an interface layer 102 on the substrate 100, and a high-k film 104 on the interface layer 102. The first device region 10 further includes a metal nitride gate electrode film 106 (first metal film) on the high-k film 104, a silicon-based cap layer 108 on the metal nitride gate electrode film 106, and a conductive film 110 (third metal film) on the silicon-based cap layer 108.

According to embodiments of the invention, the substrate 100 can contain Si, SiGe, Ge, or a compound semiconductor. The compound semiconductor can be III-V based (e.g., InGa-based). The interface layer 102 can contain a $SiO_2$ (or $SiO_x$) film, a SiN (or $SiN_y$) film, a SiON (or $SiO_xN_y$) film, a $SiGeO_x$ film, a $GeO_2$ film, or an $Al_2O_3$ film. The high-k film 104 can, for example, contain metal oxides and their silicates, including $Ta_2O_5$, $TiO_2$, $ZrO_2$, $Al_2O_3$, $Y_2O_3$, $HfSiO_x$, $HfO_2$, $ZrO_2$, $ZrSiO_x$, $TaSiO_x$, $SrO_x$, $SrSiO_x$, $LaO_x$, $LaSiO_x$, $YO_x$, or $YSiO_x$, or combinations of two or more thereof. The high-k film 104 may be deposited by atomic layer deposition (ALD), plasma-enhanced ALD (PEALD), chemical vapor deposition (CVD), or plasma-enhanced CVD (PECVD).

The metal nitride gate electrode film 106 can, for example, contain a Ti-based film or a Ta-based film, such as TiN, TaN, or TiN/TaN laminate, WN, or MoN, or a combination thereof. One purpose of the metal nitride gate electrode film 106 is to protect the high-k film 104 during further processing. The silicon-based cap layer 108 can contain or consist of Si. In one example, Si may be deposited by CVD on the metal nitride gate electrode film 106 by exposing the metal nitride gate electrode film 106 to a process gas containing silane or disilane. The conductive film 110 can, for example, contain Al, W, or Cu.

The second device region 11 contains the substrate 100, the interface layer 102 on the substrate 100, and the high-k film 104 on the interface layer 102. The second device region 20 further includes the metal nitride gate electrode film 106 (first metal film) on the high-k film 104, a metal-containing gate electrode film 112 (second metal film) on the metal nitride gate electrode film 106, the silicon-based cap layer 108 on the metal-containing gate electrode film 112, and the conductive film 110 (third metal film) on the silicon-based cap layer 108. The metal-containing gate electrode film 112 can, for example, contain a Ti-based or a Ta-based film, such as TiN, TaN, or TiN/TaN laminate, W, Mo, or a combination thereof. TiN and TaN are examples of high workfunction metal-containing gate electrode films that are suitable for metal-containing gate electrode film 112.

The presence of the metal-containing gate electrode film 112 in the second device region 11 increases the distance of the silicon-based cap layer 108 from the high-k film 104 and thus provides a higher work function for the second device region 11 compared to the first device region 10.

According to one embodiment of the invention, the silicon-based cap layer 108 may be modified by exposure to a $H_2$ gas excited by a microwave plasma source to lower the gate voltage $V_g$, which is proportional to the flat-band voltage $V_{fb}$.

Figure 2A:
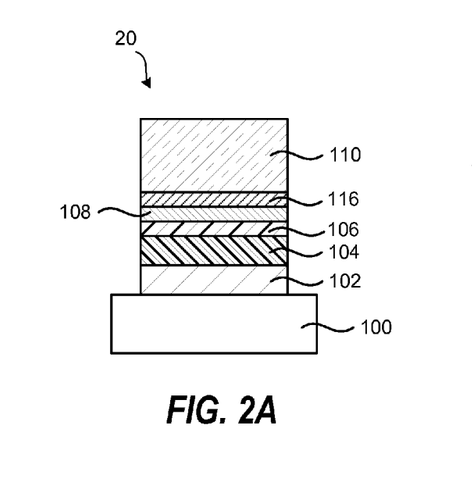
FIGS. 2A and 2B schematically show cross-sectional views of dual workfunction device regions in a semiconductor device according to an embodiment of the invention.
Figure 2B:
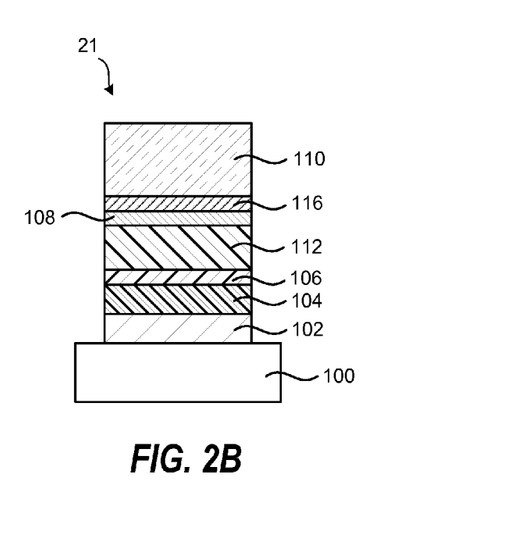

FIGS. 2A and 2B schematically show cross-sectional views of dual workfunction device regions in a semiconductor device according to an embodiment of the invention. The device regions 20 and 21 are similar to the device regions 10 and 11, respectively, but further contain a metal-containing cap layer 116 on the silicon-based cap layer 108. The metal-containing cap layer 116 can, for example, contain Ti, Co, Ni, Pt, NiPt, Ru, TiN, TaN, or a combination thereof. According to some embodiments, the metal-containing cap layer 116 (e.g., Ti, Co, or NiPt) may react with the silicon-based cap layer 108 during processing at low temperatures to form an electrically conductive metal silicide that lowers the $V_g$.

Figure 3A:
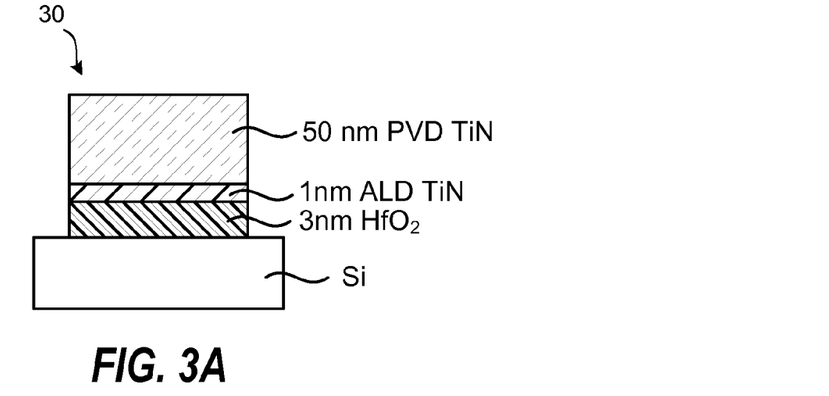
FIGS. 3A-3C schematically shows cross-sectional views of test structures for measuring $C_g$ as a function of $V_g$ according to an embodiment of the invention.
Figure 3B:
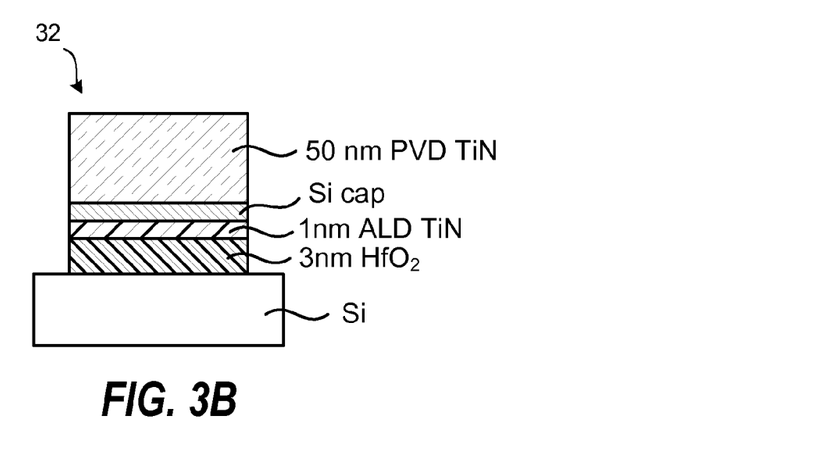
Figure 3C:
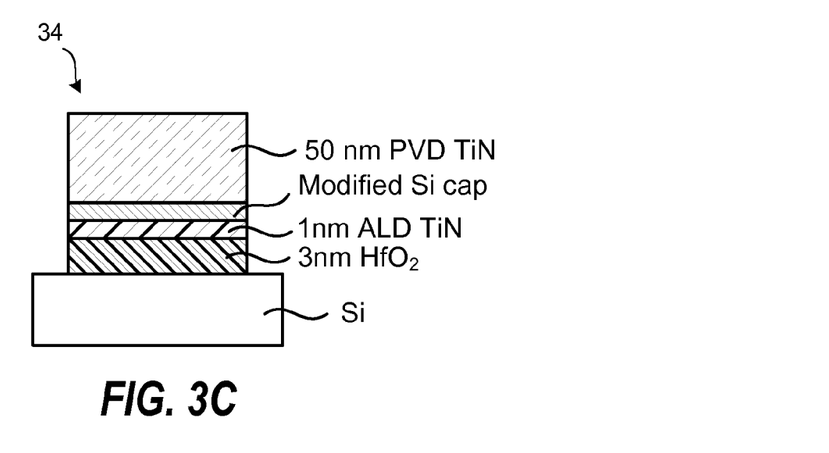

FIGS. 3A-3C schematically shows cross-sectional views of test structures for measuring gate capacitance (per unit area) $C_g$ as a function of $V_g$ according to an embodiment of the invention. In FIG. 3A, the control test structure 30 includes a Si substrate, a 3nm $HfO_2$ layer on the Si substrate, a 1nm ALD TiN layer on the $HfO_2$ layer, and a 50nm PVD TiN layer on the ALD TiN layer. The test structure 32 in FIG. 3B is similar to the test structure 32 but further includes a Si cap layer between the ALD TiN layer and the PVD TiN layer. The test structure 34 in FIG. 3C is similar to the control test structure 30 but the Si cap layer was modified by exposure to a $H_2$ gas excited by a microwave plasma source.

Figure 3D:
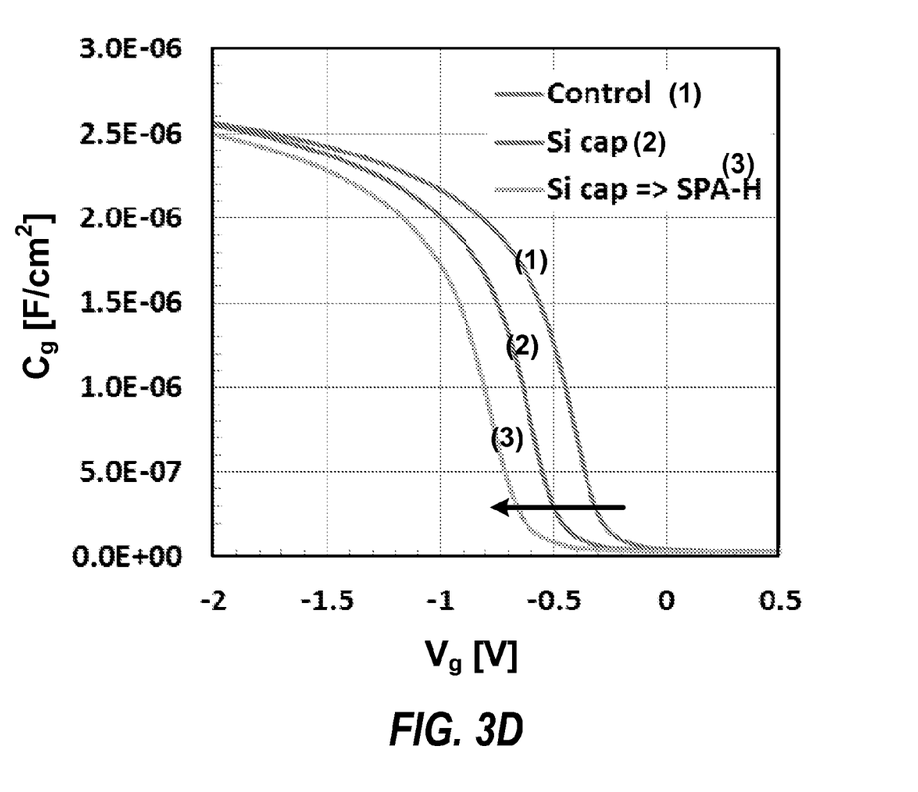
FIG. 3D shows $C_g$ as a function of $V_g$ for the test structures schematically shown in FIGS. 3A-3C.

FIG. 3D shows $C_g$ as a function of $V_g$ for the test structures schematically shown in FIG. 3A-3C. The results demonstrate effectiveness of the Si cap layer and the modified Si cap layer to lower the $V_g$ (related to $V_t$) for a NMOS semiconductor device. The presence of the Si cap layer (test structure 32 in FIG. 3B) lowered the $V_g$ by 260mV when comparing curve 2 to curve 1. When the Si cap layer was modified by the $H_2$ gas excited by a microwave plasma source (test structure 34 in FIG. 3C), the $V_g$ was lowered by 380mV when comparing curve 3 to curve 1. In summary, FIGS. 3A-3D demonstrate how a Si cap layer and a modified Si cap layer may be used to effectively lower (shift) the $V_g$. The plasma exposure is referred to as a SPA treatment in FIG. 3D. One example of a microwave plasma source is a RLSA™ plasma source from Tokyo Electron Limited, Akasaka, Japan.

Figure 4A:
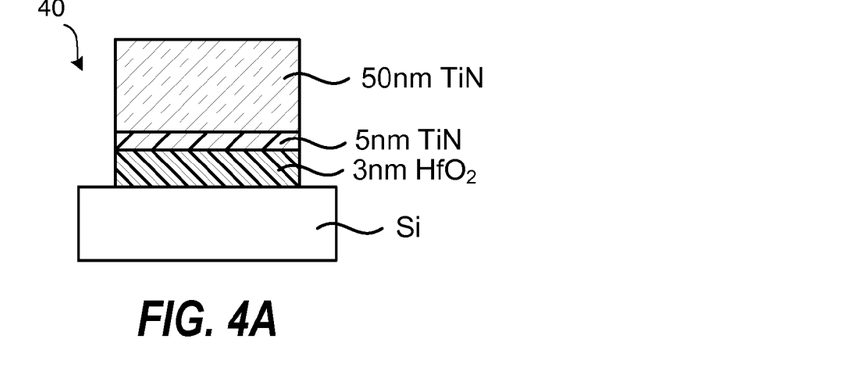
FIGS. 4A-4B schematically shows cross-sectional views of a test structures for measuring $V_{fb}$ as a function of bottom TiN thickness for a semiconductor device according to an embodiment of the invention.
Figure 4B:
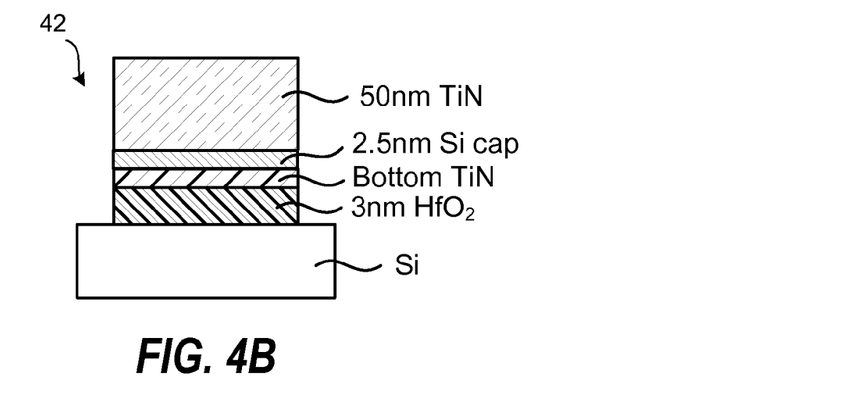

FIGS. 4A-4B schematically shows cross-sectional views of a test structures for measuring $V_{fb}$ as a function of bottom TiN thickness for a semiconductor device according to an embodiment of the invention. In FIG. 4A, the control test structure 40 includes a Si substrate, a 3 nm $HfO_2$ film on the Si substrate, a 5 nm TiN film on the $HfO_2$ film, and a 50 nm TiN film on the ALD TiN film. The test sample in FIG. 4B had varying bottom TiN film thickness up to 150 Angstrom and further contained a 2.5 nm Si cap layer between the 50 nm TiN film and the bottom TiN film.

Figure 4C:
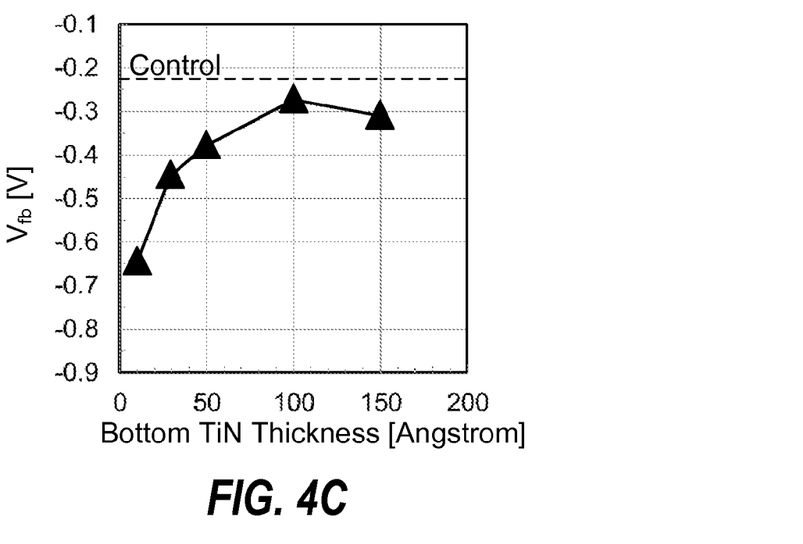
FIG. 4C shows $V_{fb}$ as a function of bottom TiN thickness for the test structures schematically shown in FIGS. 4A and 4B.

FIG. 4C shows $V_{fb}$ as a function of bottom TiN thickness for the test structures schematically shown in FIGS. 4A and 4B, The results in FIG. 4C show that the presence of the Si cap layer lowered the $V_{fb}$ and this effect is reduced as the Si cap layer is further removed from the HfO$_2$ layer by increasing the thickness of the bottom TiN film.

Figure 5A:
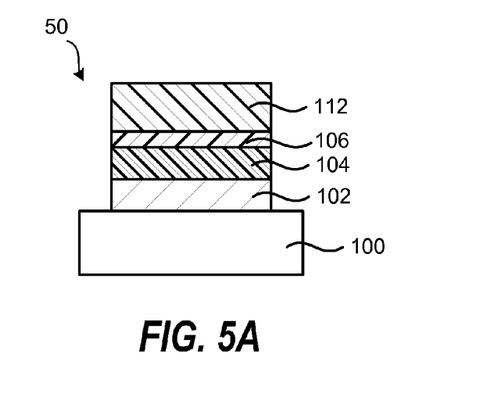
FIGS. 5A-5H schematically show a process flow for forming a semiconductor device according to an embodiment of the invention.
Figure 5B:
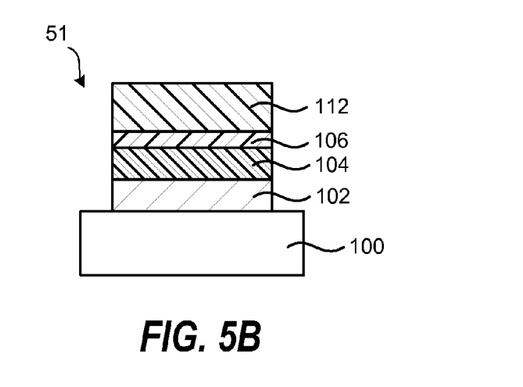

FIGS. 5A-5H schematically show a process flow for forming a semiconductor device according to an embodiment of the invention. FIG. 5A-5B schematically show a first device region 50 (NMOS) and a second device region 51 (PMOS). The first and second device regions 50, 51 contain a substrate 100, an interface layer (IL) 102 on the substrate 100, and a high-k film 104 on the interface layer 102. According to another embodiment, the interface layer 102 may omitted. The first and second device regions 50, 51 further include a metal nitride gate electrode film 106 (first gate electrode film) on the high-k film 104, and a metal-containing gate electrode film 112 (second gate electrode film) on the metal nitride gate electrode film 106.

Figures 5C, 5D:
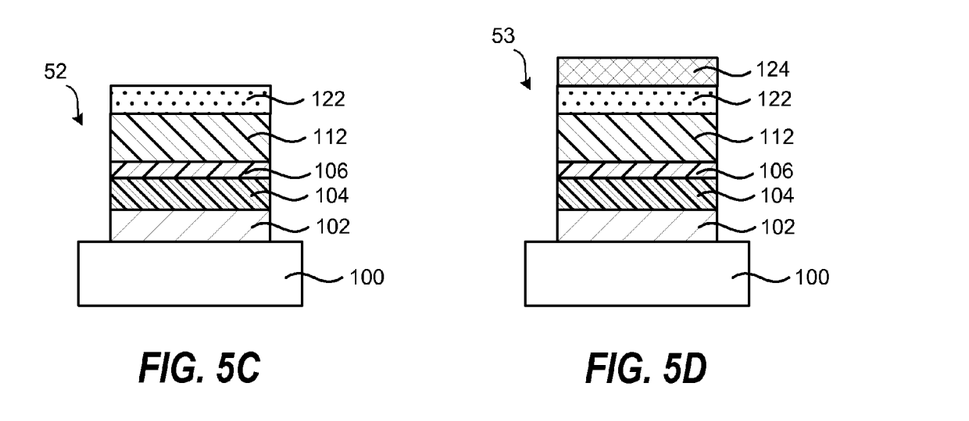

FIGS. 5C and 5D further shows a hardmask 122 (HM) formed on the first and second device regions 52, 53, and a patterned photoresist layer 124 (PR) formed on the second device region 53. The patterned photoresist layer 124 can be formed using standard lithography techniques.

Figures 5E, 5F:
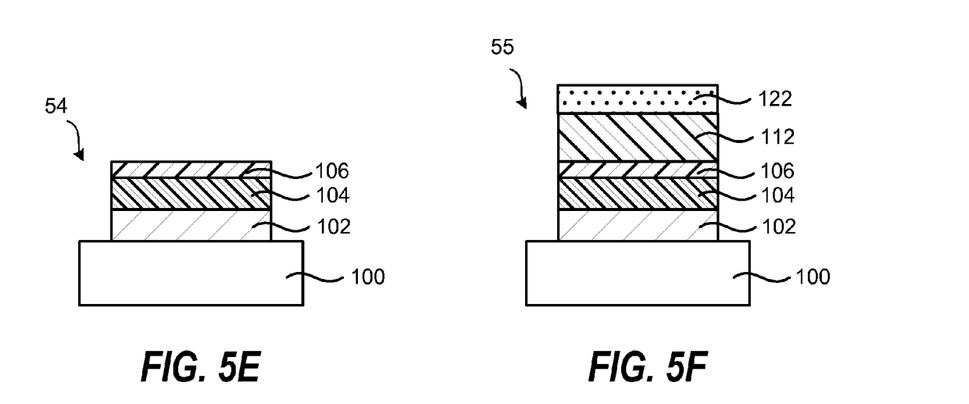

FIGS. 5E and 5F show removal of the hardmask 122 from the first device region 54, removal of the patterned photoresist layer 124 from the second device region 55 using an ashing process, and removal of the metal-containing gate electrode film 112 from the first device region 54 using an etching process.

Figure 5G:
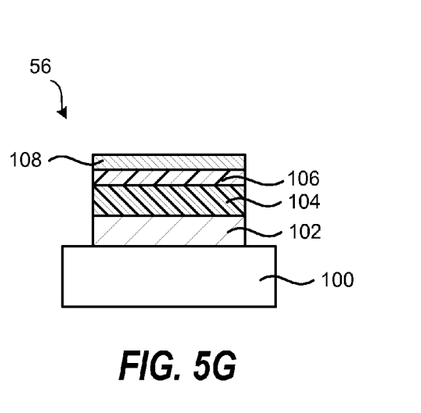
Figure 5H:
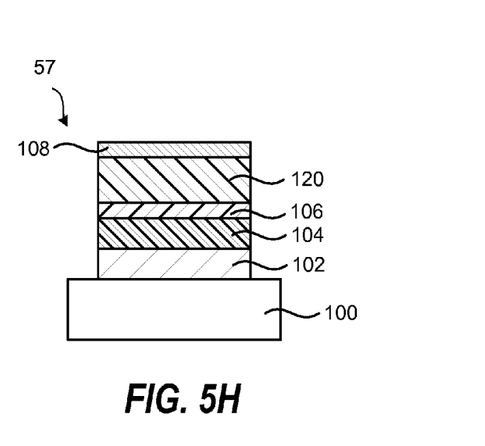

FIGS. 5G and 5H shows removal of the hardmask 122 from the second device region 57 and deposition of a silicon-based cap layer 108 on the first and second device regions 56, 57. Thereafter, a conductive film (not shown) may be deposited on the silicon-based cap layer 108. According to one embodiment of the invention, the silicon-based cap layer 108 may be exposed to a H$_2$ gas excited by a microwave plasma source to lower the V$_{fb}$ of the device.

Figure 6A:
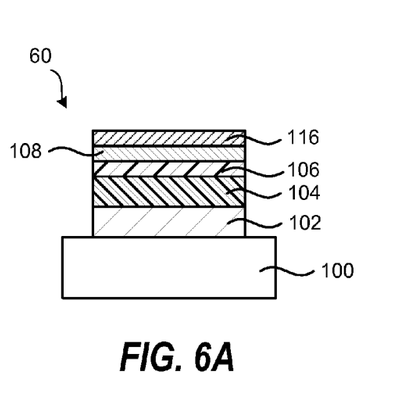
FIGS. 6A and 6B schematically show a semiconductor device according to an embodiment of the invention.
Figure 6B:
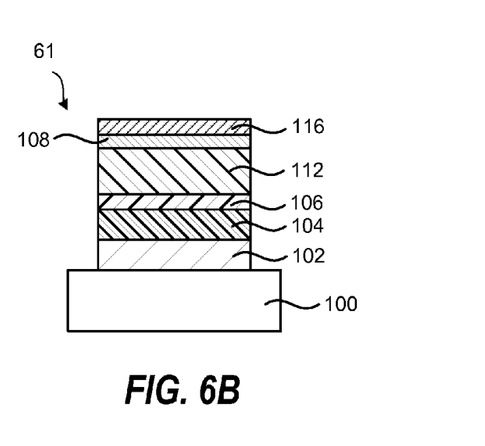

FIGS. 6A and 6B schematically show a semiconductor device according to an embodiment of the invention. The device regions 60 and 61 are similar to the device regions 56 and 57, respectively, but further contain a metal-containing cap layer 116 on the silicon-based cap layer 108.

Figure 7A:
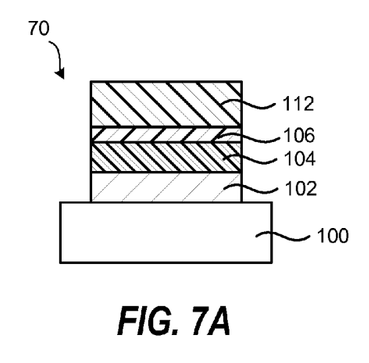
FIGS. 7A-7H schematically show a process flow for forming a semiconductor device according to an embodiment of the invention.
Figure 7B:
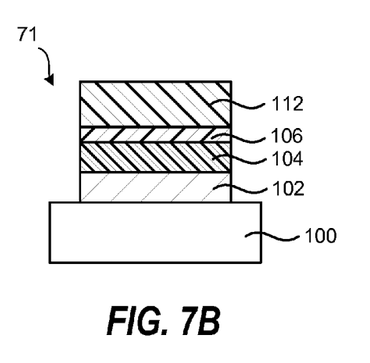

FIGS. 7A-7H schematically show a process flow for forming a semiconductor device according to an embodiment of the invention. The embodiment in FIGS. 7A-7H is similar to the embodiment described in FIGS. 5A-5H but the hardmask 122 is omitted. FIGS. 7A and 7B schematically show a first device region 70 (NMOS) and a second device region 71 (PMOS). The first and second device regions 70, 71 contain a substrate 100, an interface layer (IL) 102 on the substrate 100, and a high-k film 104 on the interface layer 102. According to another embodiment, the interface layer 102 may omitted. The first and second device regions 70, 71 further include a metal nitride gate electrode film 106 (first gate electrode film) on the high-k film 104, and a metal-containing gate electrode film 112 (second gate electrode film) on the metal nitride gate electrode film 106.

Figure 7C:
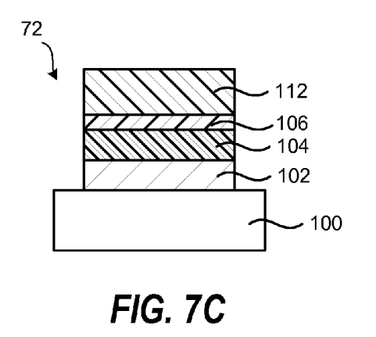
Figure 7D:
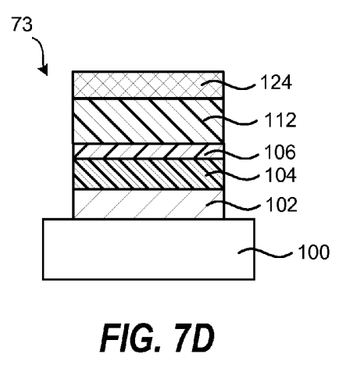

FIGS. 7C and 7D further show a patterned photoresist 124 (PR) formed on the second device region. The patterned photoresist 124 can be formed using standard lithography techniques.

Figure 7E:
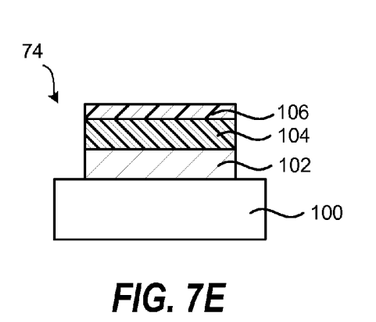
Figure 7F:
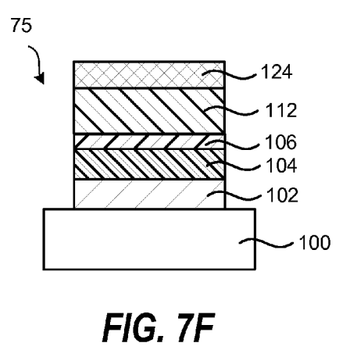

FIGS. 7E and 7F show removal of the metal-containing gate electrode film 112 from the first device region 54 using an etching process.

Figure 7G:
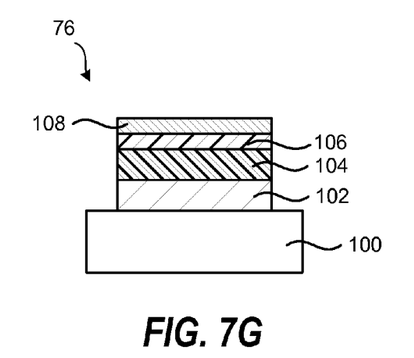
Figure 7H:
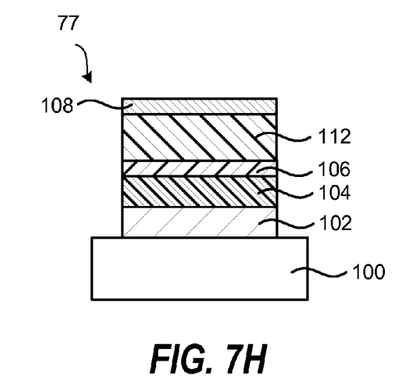

FIGS. 7G and 7H show deposition of a silicon-based cap layer 108 on the first and second device regions 76, 77. Thereafter, a conductive film (not shown) may be deposited on the silicon-based cap layer 108. According to one embodiment of the invention, the silicon-based cap layer 108 may be exposed to a H$_2$ gas excited by a microwave plasma source to lower the V$_{fb}$ of the device.

Figure 8A:
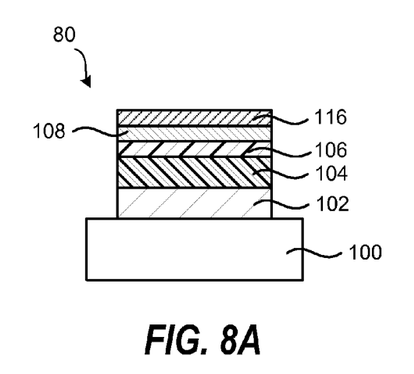
FIGS. 8A and 8B schematically show a semiconductor device according to an embodiment of the invention.
Figure 8B:
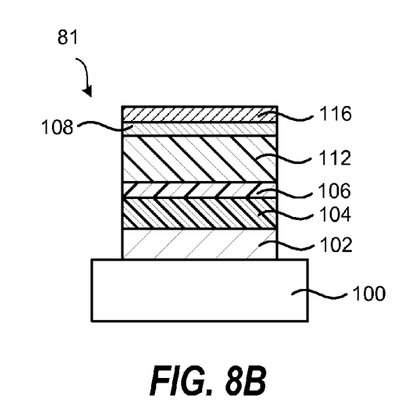

FIGS. 8A and 8B schematically show a semiconductor device according to an embodiment of the invention. The device regions 80 and 81 are similar to the device regions 76 and 77, respectively, but further contain a metal-containing cap layer 116 on the silicon-based cap layer 108.

A method of forming a semiconductor device is disclosed in various embodiments. The foregoing description of the embodiments of the invention has been presented for the purposes of illustration and description. It is not intended to be exhaustive or to limit the invention to the precise forms disclosed. This description and the claims following include terms that are used for descriptive purposes only and are not to be construed as limiting. Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. A method of forming a semiconductor device, the method comprising:
   providing a substrate containing first and second device regions, and a high-k film on the substrate;
   depositing a metal nitride gate electrode film on the high-k film;
   forming a metal-containing gate electrode film on the metal nitride gate electrode film in the second device region but not in the first device region;
   depositing a Si-based cap layer on the metal-containing gate electrode film in the second device region and on the metal nitride gate electrode film in the first device region; and
   exposing the Si-based cap layer to a H$_2$ gas excited by a microwave plasma source to lower the V$_{fb}$ of the device.

2. The method of claim 1, wherein the metal nitride gate electrode film contains TiN, TaN, TiN/TaN laminate, WN, or MoN.

3. The method of claim 1, wherein the metal-containing gate electrode film contains TiN, W, Mo, or TaN, or a combination thereof.

4. The method of claim 1, further comprising
   depositing a metal-containing cap layer on the Si-based cap layer, wherein the metal-containing cap layer reacts with the Si-based cap layer to form an electrically conductive silicide.

5. The method of claim 4, wherein the metal-containing cap layer is selected from Ti, Co, Ni, Pt, Ru, TiN, TaN, or a combination thereof.

6. The method of claim 1, wherein the Si-based cap layer consists of Si.

7. The method of claim 1, wherein forming the metal-containing gate electrode film on the metal nitride gate electrode film in the second device region comprises
   depositing the metal-containing gate electrode film in the first and second device regions; and
   selectively removing the metal-containing gate electrode film from the first device region.

8. The method of claim 7, wherein the selectively removing the metal-containing gate electrode film further comprises forming a patterned photoresist layer containing an opening that exposes the metal-containing gate electrode film in the first device region; and etching the metal-containing gate electrode film from the first device region.

9. The method of claim 7, wherein the selectively removing the metal-containing gate electrode film further comprises forming a patterned photoresist layer and a hard mask layer that contain an opening that exposes the metal-containing gate electrode film in the first device region; and etching the metal-containing gate electrode film from the first device region.

10. The method of claim 1, the substrate further comprising an interface layer between the first and second device regions and the high-k layer, wherein the interface layer contains $SiO_2$, $SiGeO_x$, $GeO_2$, $SiN$, or $Al_2O_3$, or a combination thereof.

11. The method of claim 1, wherein the high-k layer is hafnium-based, zirconium-based, tantalum-based, titanium-based, or a combination thereof.

12. The method of claim 1, wherein the high-k layer contains $Ta_2O_5$, $TiO_2$, $ZrO_2$, $Al_2O_3$, $Y_2O_3$, $HfSiO_x$, $HfO_2$, $ZrO_2$, $ZrSiO_x$, $TaSiO_x$, $SrO_x$, $SrSiO_x$, $LaO_x$, $LaSiO_x$, $YO_x$, or $YSiO_x$, or combinations of two or more thereof.

13. The method of claim 1, wherein the substrate contains Si, SiGe, Ge, or a III-V material.

14. The method of claim 1, wherein depositing the Si-based cap layer includes exposing the substrate to a process gas containing silane or disilane.

15. The method of claim 1, wherein the first device region has a lower $V_{fb}$ than the second device region.

16. The method of claim 1, wherein the metal nitride gate electrode film and the metal-containing gate electrode film both contain TiN.

17. A method of forming a semiconductor device, the method comprising:

providing a substrate containing first and second device regions, and a high-k film on the substrate;

depositing a first TiN gate electrode film on the high-k film;

forming a second TiN gate electrode film on the first TiN gate electrode film in the second device region but not in the first device region;

depositing a Si cap layer on the first TiN gate electrode film in the first device region and on the second TiN gate electrode film in the second device region; and exposing the Si cap layer to a $H_2$ gas excited by a microwave plasma source to lower the $V_{fb}$ of the device.

18. The method of claim 17, further comprising depositing a metal-containing cap layer on the Si cap layer, wherein the metal-containing cap layer reacts with the Si cap layer to form an electrically conductive silicide.

* * * * *

UNITED STATES PATENT AND TRADEMARK OFFICE
CERTIFICATE OF CORRECTION

PATENT NO. : 9,698,020 B2  
APPLICATION NO. : 14/918503  
DATED : July 4, 2017  
INVENTOR(S) : Genji Nakamura et al.

Page 1 of 2

It is certified that error appears in the above-identified patent and that said Letters Patent is hereby corrected as shown below:

On the Title Page

Column 1, the title "CMOS VT CONTROL INTEGRATION BY MODIFICATION OF METAL-CONTAINING GATE ELECTRODES" should read --CMOS $V_t$ CONTROL INTEGRATION BY MODIFICATION OF METAL-CONTAINING GATE ELECTRODES--.

In the Specification

In Column 2, Line 51, "FIGS. 3A-3C schematically shows" should read --FIGS. 3A-3C schematically show--.

In Column 2, Line 56, "FIGS. 4A-4B schematically shows" should read --FIGS. 4A-4B schematically show--.

In Column 2, Line 57, "of a test structures" should read --of test structures--.

In Column 4, Line 26, "FIGS. 3A-3C schematically shows" should read --FIGS. 3A-3C schematically show--.

In Column 4, Line 33, "similar to the test structure 32" should read --similar to the control test structure 30--.

In Column 4, Line 39, "shown in FIG. 3A-3C." should read --shown in FIGS. 3A-3C.--.

In Column 4, Line 43, "lowered the V $_g$by 260Mv" should read --lowered the $V_g$ by 260Mv--.

In Column 4, Line 54, "FIGS. 4A-4B schematically shows" should read --FIGS. 4A-4B schematically show--.

In Column 4, Line 66, "4B, The results" should read --4B. The results--.

Signed and Sealed this  
Fifth Day of December, 2017

Joseph Matal  
*Performing the Functions and Duties of the*  
*Under Secretary of Commerce for Intellectual Property and*  
*Director of the United States Patent and Trademark Office*

CERTIFICATE OF CORRECTION (continued)
U.S. Pat. No. 9,698,020 B2

In Column 5, Line 5, "FIG. 5A-5B schematically show" should read --FIGS. 5A-5B schematically show--.

In Column 5, Line 11, "102 may omitted." should read --102 may be omitted.--.

In Column 5, Line 17, "FIGS. 5C and 5D further shows" should read --FIGS. 5C and 5D further show--.

In Column 5, Line 28, "FIGS. 5G and 5H shows" should read --FIGS. 5G and 5H show--.

In Column 5, Line 51, "102 may omitted." should read --102 may be omitted.--.

In the Claims

In Column 8, Line 5, Claim 15, "has a lower $V_{fb}$ than the second" should read --has a lower $V_{fb}$ than the second--.